(12) United States Patent
Kim

(10) Patent No.: US 8,648,406 B2
(45) Date of Patent: Feb. 11, 2014

(54) SINGLE POLY EEPROM HAVING A TUNNEL OXIDE LAYER

(75) Inventor: Hangeon Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 13/463,268

(22) Filed: May 3, 2012

(65) Prior Publication Data

US 2013/0168755 A1 Jul. 4, 2013

(30) Foreign Application Priority Data

Dec. 29, 2011 (KR) .................. 10-2011-0146422

(51) Int. Cl.
*H01L 29/788* (2006.01)

(52) U.S. Cl.
USPC ............... 257/321; 257/317; 257/E29.042

(58) Field of Classification Search
USPC .................. 257/317, 321, E29.042
See application file for complete search history.

(56) References Cited

U.S. PATENT DOCUMENTS

| | | | | |
|---|---|---|---|---|
| 4,958,321 A * | 9/1990 | Chang | ...................... | 365/185.3 |
| 5,063,423 A * | 11/1991 | Fujii et al. | ...................... | 257/316 |
| 5,780,893 A * | 7/1998 | Sugaya | ...................... | 257/318 |
| 6,121,666 A * | 9/2000 | Burr | ...................... | 257/408 |
| 6,177,702 B1 * | 1/2001 | Kakoschke | ...................... | 257/321 |
| 6,225,660 B1 * | 5/2001 | Liu | ...................... | 257/318 |
| 6,313,498 B1 * | 11/2001 | Chen | ...................... | 257/316 |
| 6,323,517 B1 * | 11/2001 | Park et al. | ...................... | 257/326 |
| 6,432,762 B1 * | 8/2002 | Dalla Libera et al. | ........ | 438/217 |
| 6,465,307 B1 * | 10/2002 | Chidambaram et al. | ...... | 438/286 |
| 6,548,355 B2 * | 4/2003 | Pio | ...................... | 438/264 |
| 7,164,177 B2 * | 1/2007 | Chang et al. | ................. | 257/406 |
| 7,268,387 B2 * | 9/2007 | Kurokawa et al. | ............ | 257/317 |
| RE40,486 E * | 9/2008 | Lojek et al. | ...................... | 257/316 |
| 8,026,545 B2 * | 9/2011 | Sekiguchi | ...................... | 257/321 |
| 8,383,475 B2 * | 2/2013 | Jung et al. | ...................... | 438/201 |
| 2009/0127612 A1 | 5/2009 | Park et al. | | |
| 2011/0140189 A1 * | 6/2011 | Kang | ...................... | 257/321 |

FOREIGN PATENT DOCUMENTS

| | | | |
|---|---|---|---|
| JP | 11274326 A | * | 10/1999 |
| KR | 10-0745030 | | 7/2007 |
| KR | 10-2009-0050389 | | 5/2009 |

* cited by examiner

*Primary Examiner* — Ida M Soward

(74) *Attorney, Agent, or Firm* — Sherr & Jiang, PLLC

(57) ABSTRACT

A single poly EEPROM (Electrically Erasable Programmable Read Only Memory), which may include at least one of the following: (1) A second conductive type well formed on and/or over a semiconductor substrate. (2) A first conductive type source and drain regions formed in the second conductive type well. The single poly EEPROM may include at least one of: (a) A tunnel oxide layer formed on and/or over the second conductive type well. (b) A floating gate formed on and/or over the tunnel oxide layer and doped with second conductive type impurity ions. (c) A first conductive type impurity region formed in the second conductive type well adjacent to the floating gate. The floating gate may be configured such that a concentration of a region of the floating gate adjacent to the drain region is higher than that of the other region of the floating gate adjacent to the impurity region.

10 Claims, 9 Drawing Sheets

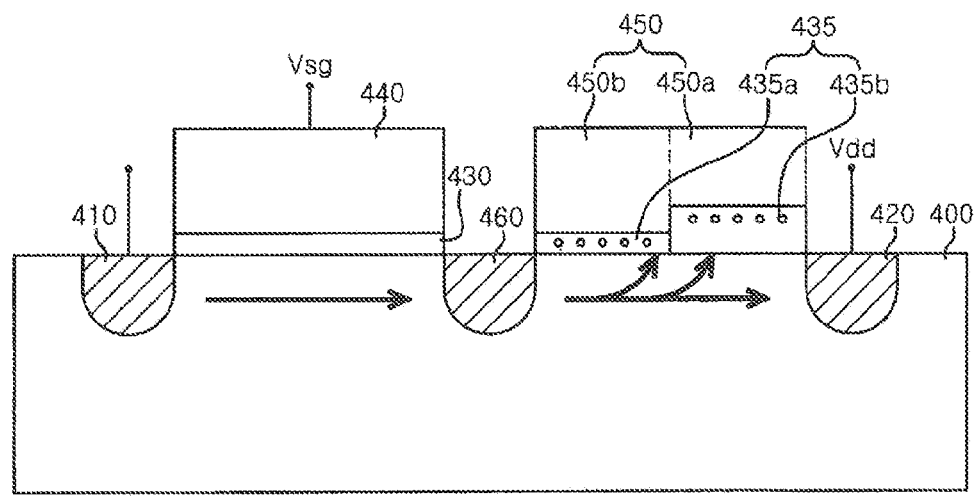
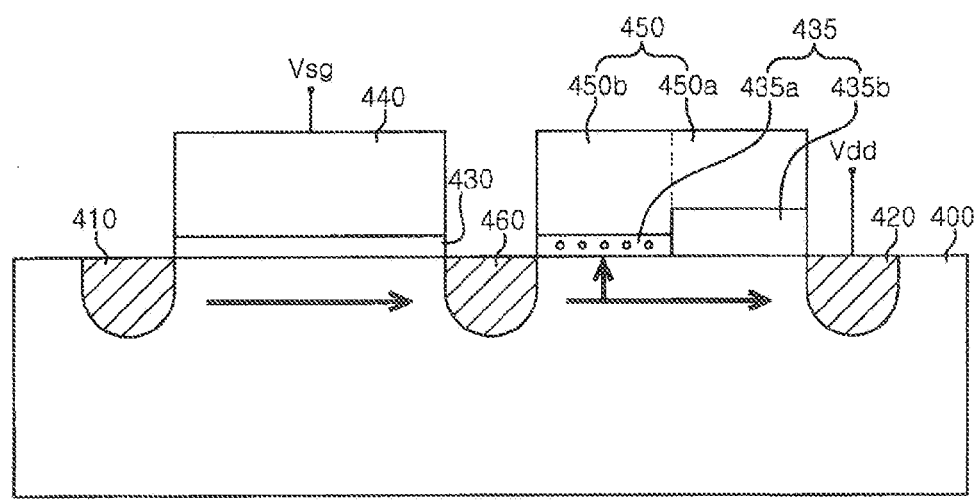

SINGLE POLY EEPROM HAVING A TUNNEL OXIDE LAYER

This application claims priority to Korean Patent Application No. 10-2011-0146422 (filed on Dec. 29, 2011), which is hereby incorporated by reference in its entirety.

BACKGROUND

EEPROM (Electrically Erasable Programmable Read Only Memory) enables electrical erasing and writing of data and may be capable of retaining data even when there is no power. Electrical erasing and programming may be performed using tunneling, so that a user is able to change the information stored in the EEPROM. However, EEPROMs are often configured such that each cell includes two transistors, which may create complexities in applications (e.g. relatively larger area consumption and relatively high price) compared to an EPROM.

Non-volatile memory may be advantageous because stored data is not lost even when the power is off. Non-volatile memory may be used in the field of data storage, such as PC BIOS, set top boxes, printers, network servers, digital cameras, mobile phones, and similar devices.

With reference to the appended drawings, a related art single poly EEPROM device will be described below.

FIG. 1A illustrates a program operation by way of channel hot electron injection, in accordance with the related art. A specific voltage may be induced to a floating gate by program voltage +Vp being applied to an N-well (e.g. the voltage induced to the floating gate is determined by a coupling ratio). A channel region of NMOS (N-Metal Oxide Semiconductor) may be inversed by the specific voltage induced to, the floating gate.

When a specific voltage VDS is applied to a drain region of NMOS, current flows toward a source from the drain and channel hot electrons generated in the vicinity of a drain junction region are injected into the floating gate, thereby increasing a threshold voltage of the NMOS device.

FIG. 1B illustrates an erase operation by way of a F/N (Fowler-Nordheim) tunneling, in accordance with the related art. An N-well may be grounded and an erase voltage +VE may be applied to the source/drain of NMOS. A potential that is approximately at ground may be induced to the floating gate by the ground voltage being applied to the N-well. An electric field may be strongly biased toward the floating gate from the source/drain of NMOS by the erase voltage +VE applied to the source/drain of NMOS. The electrons that are present in the floating gate may escape into the source/drain regions via F/N tunneling under the applied electric field, thereby decreasing the threshold voltage of the NMOS device.

FIG. 1C illustrates a read operation in an EEPROM, in accordance with the related art. A read voltage +VR may be applied to an N-well, whereby a specific voltage may be induced to a floating gate. A positive drain voltage for reading may be applied to the drain of an NMOS device and the source of the NMOS device may be grounded.

If the threshold voltage of the NMOS device is very high under a programming condition where electrons are injected into the floating gate, the NMOS device cannot be turned on even with the specific voltage induced to the floating gate. Since the NMOS device cannot be turned on, no current flows. In an erase condition wherein electrons are absent in the floating gate, the threshold voltage of the NMOS device may be very low and therefore the NMOS device can be turned on even with the specific voltage induced to the floating gate, so that current may flow.

In some related art EEPROM devices, a tunnel oxide layer may be formed between the floating gate and the N-well and channel hot electrons that are generated in the vicinity of the drain junction region may be trapped using the tunnel oxide layer. However, using the tunnel oxide layer may be problematic because a voltage higher than the voltage biased from the source to the drain should be applied to the floating gate, which may undesirably affect other devices. For this reason, when voltage is not sufficiently applied to the floating gate there may be undesirable decreases in reliability of a device.

In some related art single poly EEPROM cells, because the N-well should be formed to enable a specific potential to be induced to the floating gate so as to execute program/erase/read operations, the unit cell area is relatively large, making it difficult to implement. EEPROMs at a high density.

SUMMARY

Embodiments relate to a semiconductor memory cell (e.g. a single poly EEPROM) which is capable of increasing cell density and decreasing an operating voltage and to a method for fabricating the same. In embodiments, a single poly EEPROM is capable of increased cell-density by forming tunnel oxide layers having different thicknesses under a floating gate. Embodiments may cause electric field crowding to reduce operating voltage by forming an etched pattern in a partial region of a floating gate. Embodiments may cause an operating voltage difference using a work-function difference of the floating gate by providing a floating gate having different conductive type impurity concentration distributions.

The objects of embodiments are not limited to those above and the other objects which are not mentioned herein will be understood from the following description by a person having ordinary skill in the art.

In accordance with embodiments, a single poly EEPROM (Electrically Erasable Programmable Read Only Memory) may include at least one of: (1) A second conductive type well configured to be formed on a semiconductor substrate. (2) A first conductive type source and drain regions configured to be formed in the second conductive type well. (3) A tunnel oxide layer configured to be formed on the second conductive type well. (4) A floating gate configured to be formed on the tunnel oxide layer and configured to be doped with second conductive type impurity ions. (5) A first conductive type impurity region configured to be formed in the second conductive type well adjacent to the floating gate, wherein the floating gate is configured such that a concentration of a region of the floating gate adjacent to the drain region is higher than that of the other region of the floating gate adjacent to the impurity region.

The floating gate may be configured such that a width of region of the floating gate adjacent to the drain region is greater than that of the other region of the floating gate adjacent to the impurity region, in accordance with embodiments. In embodiments, the floating gate may have a pattern in which a portion of the region of the floating gate adjacent to the drain region is etched. In embodiments, the floating gate may have a pattern in which a portion of the region of the floating gate adjacent to the drain region is patterned to have recesses. In embodiments, the single poly EEPROM may execute hot electron injection programming. In embodiments, the tunnel oxide layer may be configured such that a thickness of a region of the tunnel oxide layer adjacent to the drain region is greater than that of the other region of the tunnel oxide layer adjacent to the impurity region.

In accordance with embodiments, a method for fabricating single poly EEPROM includes at least one of: (1) Forming a second conductive type well on a semiconductor substrate, (2) Forming a tunnel oxide layer on the semiconductor substrate having the second conductive type well formed thereon. (3) Forming a floating gate on the tunnel oxide layer. (4) Subjecting a region of the floating gate to second conductive type impurity ion implantation, thus forming a second conductive type impurity region at the region of the floating gate. (4) Subjecting the second conductive type impurity region to heat diffusion, thus forming a high-concentration second conductive type impurity region at the region of the floating gate and forming a low-concentration second conductive type impurity region at the other region of the floating gate. (5) Performing first conductive type impurity ion implantation in the second conductive type well exposed by both sides of the floating gate, thus forming source and drain regions and an impurity region.

In embodiments, a method may include patterning a portion of the high-concentration second conductive type impurity region adjacent to the drain region. In embodiments, patterning may be performed in such a manner that the portion of the high-concentration second conductive type impurity region adjacent to the drain region is patterned to have recesses.

In embodiments, said forming the low-concentration second conductive type, impurity region may include at least one of (1) Forming a mask pattern in which only a portion of the floating gate adjacent to the drain region is opened. (2) Performing the second conductive type impurity ion implantation using the mask pattern as an ion implantation mask, so that second conductive type impurity ions are implanted in the portion of the floating gate. (3) Removing the mask pattern and then subjecting the floating gate having the second conductive type impurity ions implanted therein to heat diffusion, thus forming the high-concentration second conductive type impurity region and the low-concentration second conductive type impurity region in the floating gate.

In embodiments, said forming the tunnel oxide layer may be performed such that a thickness of a region of the tunnel oxide layer corresponding to the high-concentration second conductive type impurity region is greater than that of the other region of the tunnel oxide layer corresponding to the low-concentration second conductive type impurity region. In embodiments, first conductive type may be a P type impurity and the second conductive type may be an N type impurity.

BRIEF DESCRIPTION OF THE DRAWINGS

FIG. 6A is a view illustrating a process wherein a single poly EEPROM executes a program operation at a low voltage, in accordance with embodiments.

FIG. 6B is a view illustrating a process wherein a single poly EEPROM executes a program operation at a high voltage, in accordance with embodiments.

DESCRIPTION

Figure 1A:
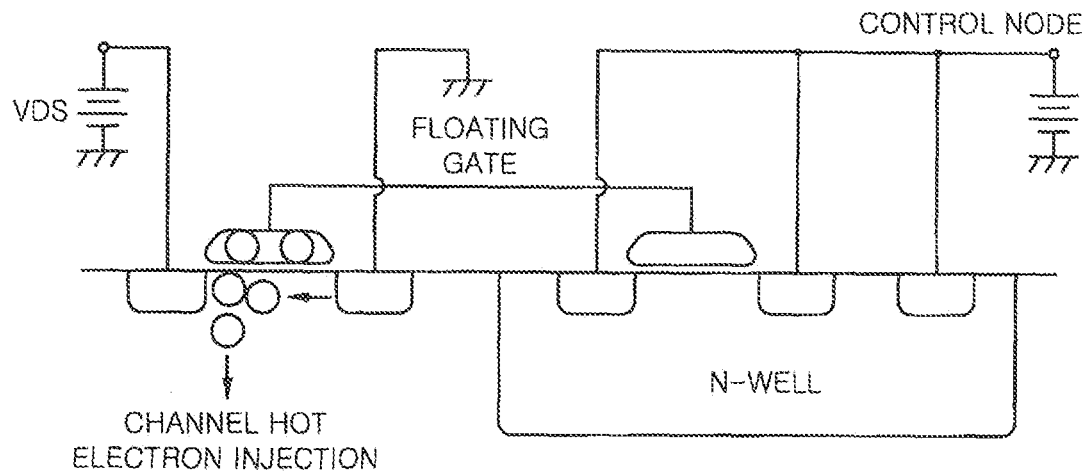
FIG. 1A is a view illustrating a program operation in a EEPROM (Electrically Erasable Programmable Read-Only Memory), in accordance with the related art.
Figure 1B:
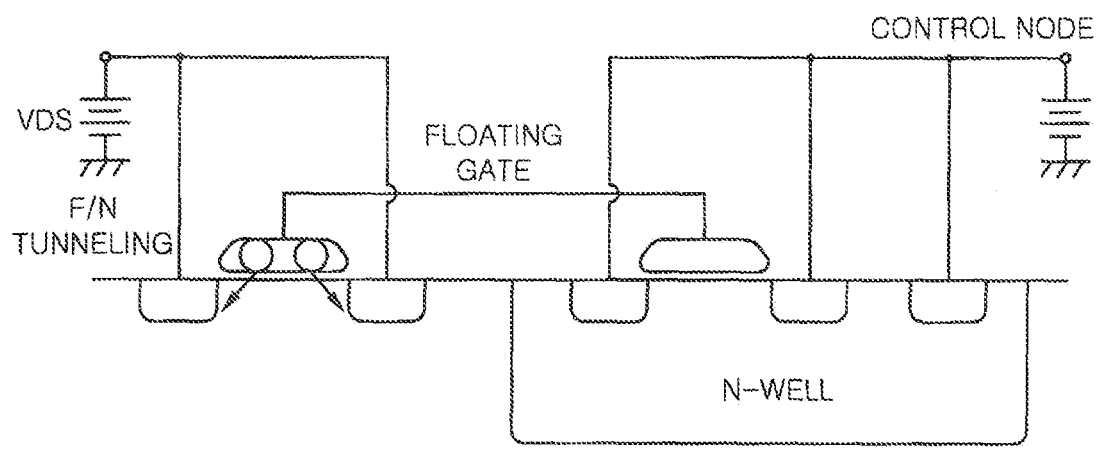
FIG. 1B is a view illustrating an erase operation in a EEPROM, in accordance with the related art.
Figure 1C:
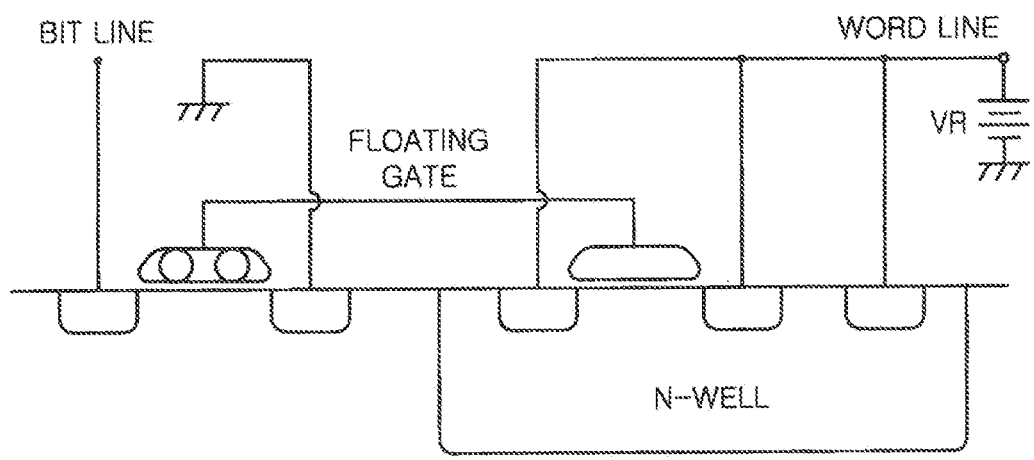
FIG. 1C is a view illustrating a read operation in a EEPROM, in accordance with the related art.

Advantages and features of embodiments and methods of accomplishing the same may be understood more readily by reference to the following detailed description of embodiments and the accompanying drawings. The embodiments may, however, be embodied in many different forms and should not be construed as being limited to the embodiments set forth herein. Rather, these embodiments are provided so that this disclosure will be thorough and complete and will fully convey the concept of the embodiments to those skilled in the art, and the embodiments will only be defined by the appended claims. Like reference numerals refer to like elements throughout the specification.

Hereinafter, single poly EEPROM and a method for fabricating the same in accordance with embodiments will be described in detail with reference to the accompanying drawings.

Figure 2:
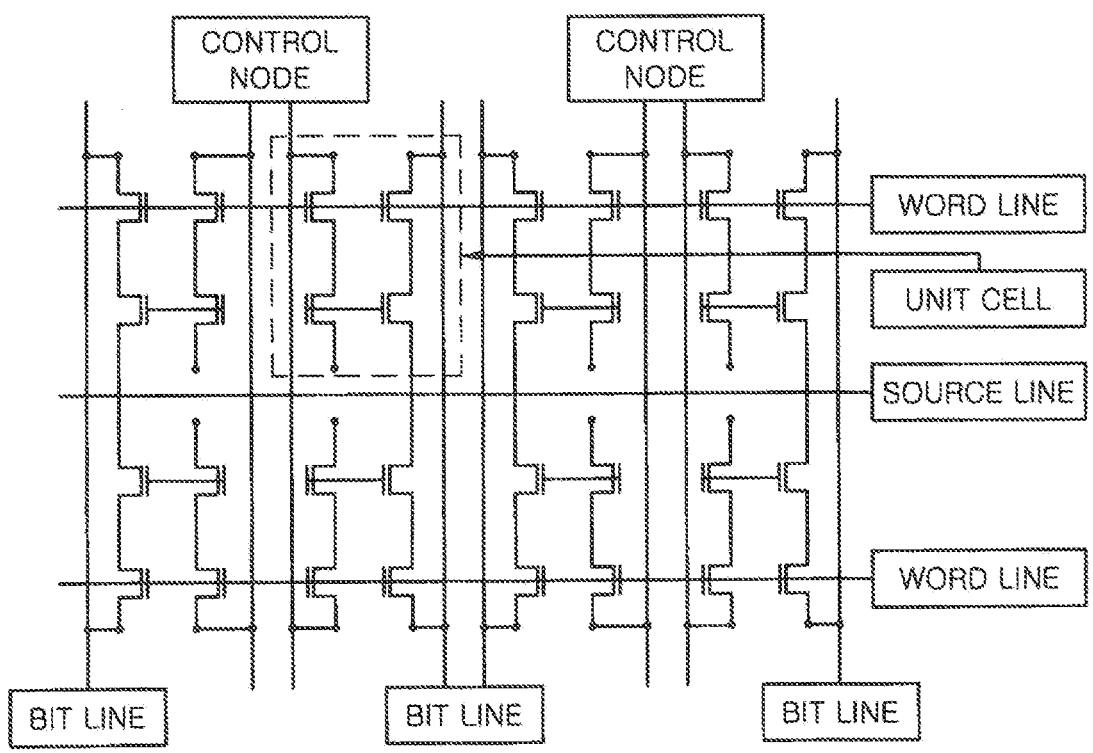
FIG. 2 is a circuit diagram illustrating a typical cell array structure, in accordance with embodiments.

A cell array illustrated in FIG. 2 is provided in the form of unit cells being repeated, in accordance with embodiments. A word line may be formed perpendicular to a bit line. A control node may be connected to a control voltage Vcn. A source line may be connected to a source voltage Vss. A word line may be connected to a select voltage Vsg. A bit line may be connected to a drain voltage Vdd.

The cell array of FIG. 2 has repeated unit cells and an example of a unit cell of a single poly EEPROM in accordance with embodiments will be described below with reference to the appended drawings.

Figure 3:
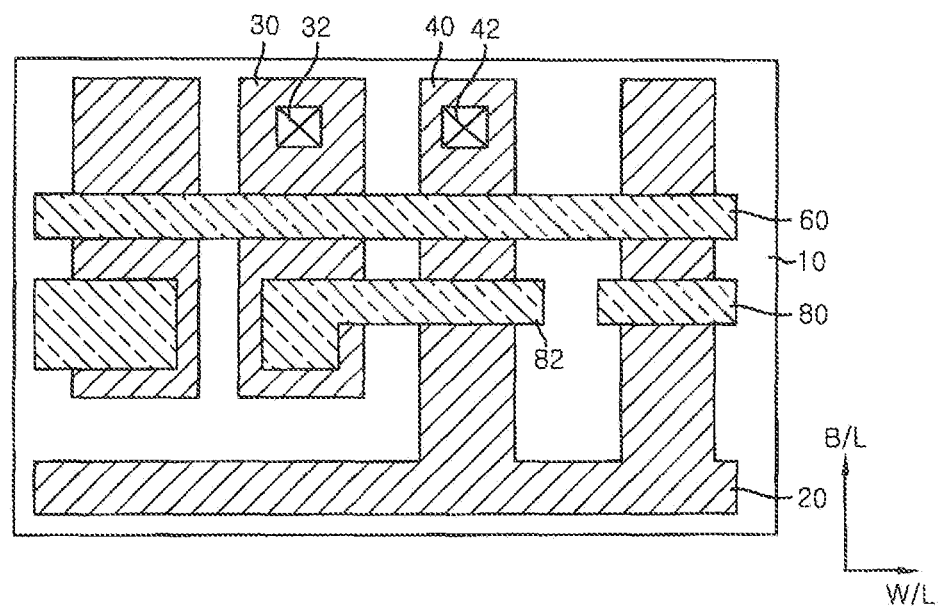
FIG. 3 is a view illustrating the unit cell layout of single poly EEPROM, in accordance with embodiments.

FIG. 3 illustrates the unit cell layout of a single poly EEPROM, in accordance with embodiments. A semiconductor substrate may be defined by an active region and a device isolation region, and a well may be formed on the semiconductor substrate. In embodiments, active regions 20, 30, 40 may be defined by a device isolation region 10 embodied via a STI (Shallow Trench Isolation) film.

Of the active regions 20, 30 and 40 illustrated in FIG. 3, active region 20 (which may extend and be formed in a long in the direction of a word line WL) may correspond to a source line. Active region 20 may be integrally formed with active region 40 corresponding to a bit line BL, in accordance with embodiments. Drain voltage Vdd may be connected via contact 42 of the bit line. In embodiments, active region 30 may correspond to the control node and may include contact 32 connected to control voltage Vcn. In embodiments, source line may be formed in the direction of the word line in a unit cell 10 and control node 30 and the bit line may be formed side by side in the direction of the bit line.

In embodiments, word line 60 may include a select gate which is extended and formed long in the direction of the word line. The select gate may be extended and formed long in the direction of word line 60 over active regions 30 and 40 while alternating between the device isolation region 10 and active regions 30 and 40, in accordance with embodiments.

In embodiments, floating gates 80 and 82 may be formed in the direction of word line 60 while being disposed side by side in the direction of the select gate and the bit line. Floating gate 82 may be located at the control node and may not overlap with device isolation region 10, but may only overlap with the upper surface of active region 30, in accordance with embodiments. Second conductive type impurity ions having different concentration distributions may be formed in floating gate 82.

Figure 4:
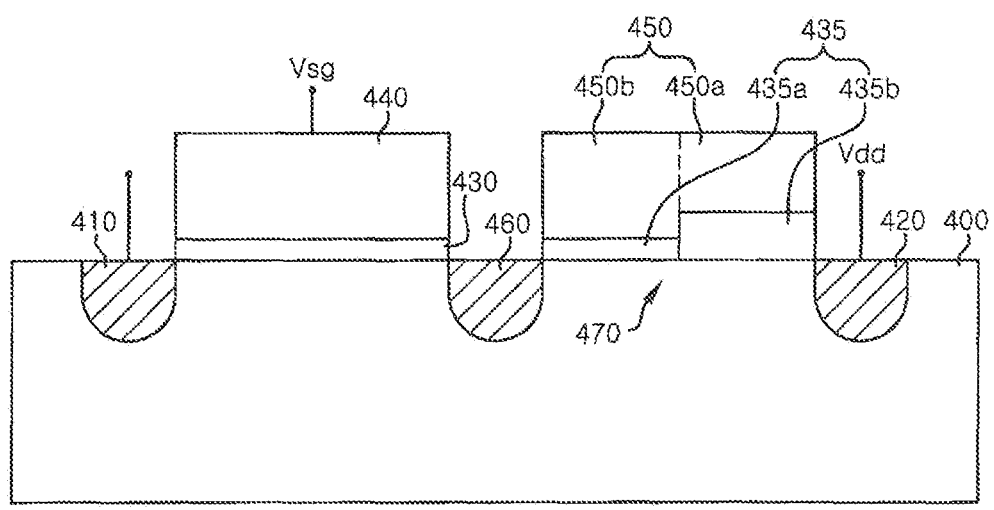
FIG. 4 is a cross-sectional view illustrating the floating gate structure in a single poly EEPROM, in accordance embodiments.

FIG. 4 is a cross-sectional view illustrating a floating gate structure of a single poly EEPROM, in accordance with embodiments. Second conductive type well 400 (e.g. an N-well) may be formed on a semiconductor substrate and source and drain regions 410, 420 may be formed in second conductive type well 400, in accordance with embodiments. In embodiments, respectively provided on tunnel oxide layers 430 and 435 are select gate 440 and floating gate 450.

In embodiments, high-concentration impurity region 460 may be formed in second conductive type well 100 between select gate 440 and floating gate 450. In embodiments, source and drain regions 410, 420 and high-concentration impurity region 460 may be formed using first conductive type impurity ions (e.g. P type impurity ions).

In embodiments, floating gate 450 may be doped with second conductive type impurity ions having different concentration distributions. In embodiments, floating gate 450 may be configured such that the concentration in first region 450a adjacent to drain region 420 is higher than the concentration in second region 450b adjacent to high-concentration impurity region 460. In embodiments, floating gate 450 may be configured such that the width of first region 450a is greater than the width of second region 450b.

Figure 5:
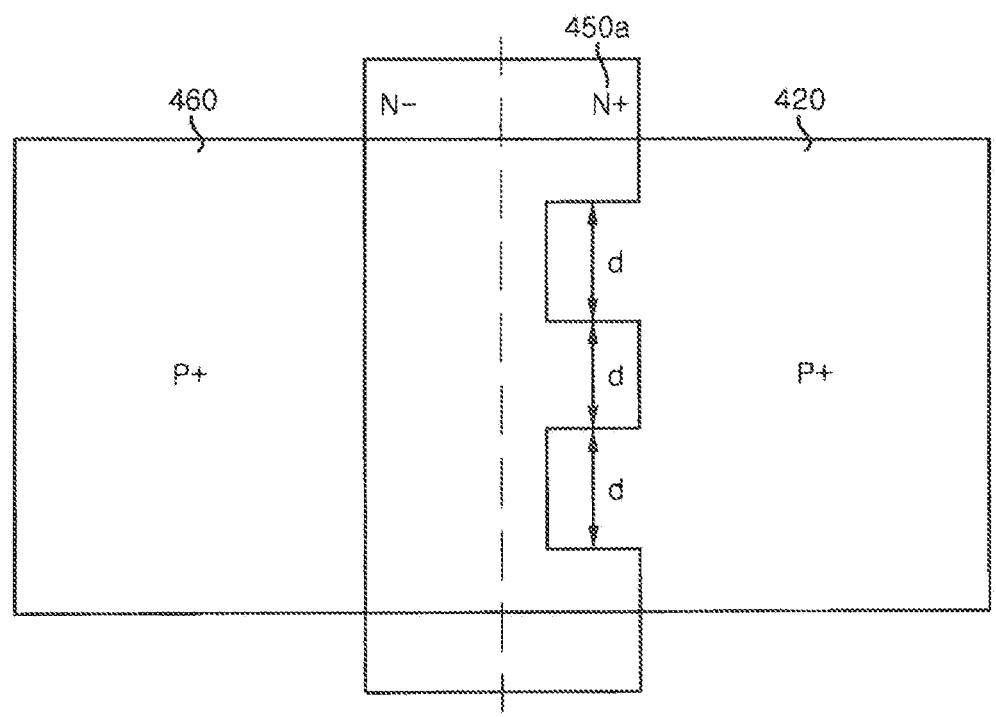
FIG. 5 is a top plan view illustrating the floating gate structure in a single poly EEPROM, in accordance with embodiments.

In embodiments illustrated in FIG. 5, floating gate 450 may be formed to have a pattern in which a portion of first region 450a is etched (e.g. an etched pattern having recesses). In embodiments, the pattern having recesses at a predetermined distance (d) (e.g. 0.5~0.7 µm) may be formed on first region 450a, thereby causing electric field crowding in first region 450a.

As mentioned above, a portion of first region 450a may have the etched pattern, having recesses and therefore when charges are transferred via channel region 470 formed in second conductive type well 400 under floating gate 450, electric field crowding may be caused in first region 450a, thus decreasing the operating voltage.

Tunnel oxide layer 435 may be formed under floating gate 450 in accordance with embodiments and may include low-voltage tunnel oxide layer 435a and high-voltage tunnel oxide layer 435b. In embodiments, provided under second region 450b of floating gate 450 is low-voltage tunnel oxide layer 435a in which charges are trapped when a relatively low voltage. (e.g. a voltage of −7 V) is applied to select gate 440 and drain region 420.

In embodiments, when a relatively high voltage (e.g. a voltage of −20 V) is applied to select gate 440 and drain region 420, charges that are transferred via channel region 470 may be trapped by the high-voltage tunnel oxide layer 435b, as well as the low-voltage tunnel oxide layer 435a. In embodiments, low-voltage tunnel oxide layer 435a may be formed to be thinner than high-voltage tunnel oxide layer 435b.

A single poly EEPROM having the above structure may operate using electron injection programming, which is described below.

As illustrated in FIG. 6A, in a program operation at a low voltage, select voltage Vsg of approximately −7 V may be applied to select gate 440 and a drain voltage Vdd of approximately −7 V may be applied to the drain region 420, in accordance with embodiments. In embodiments, a transistor may be turned on and thus current may flow through channel region 470. Accordingly, charges of part of the generated hot electrons may be trapped only by low-voltage tunnel oxide layer 435a of tunnel oxide layer 435 formed under floating gate 450 due to the electric field formed in the direction perpendicular to the gate. Such hot electrons may be injected into floating gate 450 via low-voltage tunnel oxide layer 435a. As the hot electrons are injected, the threshold voltage of the cell transistor may increase from the initial voltage.

In embodiments, in order to operate (read-on) a single poly EEPROM programmed at a relatively low voltage, a select voltage Vsg of approximately −2.8 V may be applied to select gate 440 and drain voltage Vdd of approximately −2.8 V may be applied to drain region 420.

As illustrated in FIG. 6B, in a program operation at a high voltage, a select voltage Vsg of approximately −20 V may be applied to select gate 440, and a drain voltage Vdd of approximately −20 V may be applied to drain region 420, in accordance with embodiments. In embodiments, a transistor is turned on and thus current may flow through channel region 470. In embodiments, charges of part of the generated hot electrons may be trapped by the entire tunnel oxide layer 435 of floating gate 450 due to electric field formed in the direction perpendicular to the gate. Such hot electrons may be injected into floating gate 450 via tunnel oxide layer 435. As the hot electrons are injected, the threshold voltage of the cell transistor may increase from the initial voltage, in accordance with embodiments.

In embodiments, in order to operate (read-on) a single poly EEPROM programmed at a relatively high voltage, a select voltage Vsg of approximately −2.8 V may be applied to select gate 440 and a drain voltage Vdd of approximately −1.3 V may be applied to drain region 420. In embodiments, when tunnel oxide layer 435 is formed to have different thicknesses under the floating gate 450, it may be possible to execute two types of programming using a single cell, thus increasing the cell density and reducing the unit area of the cell.

A process of forming a floating gate in a single poly EEPROM having the above structure will be described below with reference to FIGS. 7A to 7E, in accordance with embodiments.

Figure 7A:
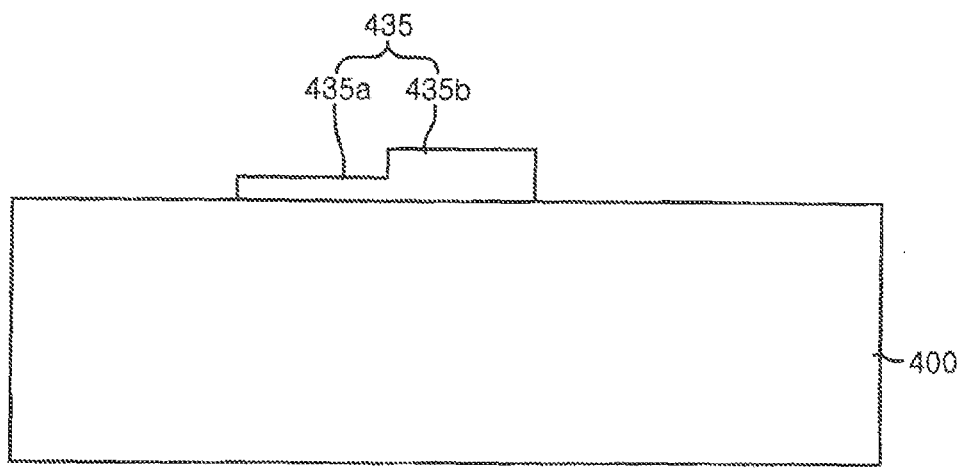
FIGS. 7A to 7E are cross-sectional views illustrating a process of forming a floating gate of a single poly EEPROM, in accordance with embodiments.

As illustrated in FIG. 7A, second conductive type well 400 may be formed on a semiconductor substrate, after which low-voltage and high-voltage tunnel oxide layers 435a, 435b may be formed on second conductive type well 400, in accordance with embodiments. In embodiments, an oxide layer may be deposited on the semiconductor substrate having second conductive type well 400 formed thereon. The oxide layer may then be etched at different etching ratios, thus forming low-voltage tunnel oxide layer 435a and high-voltage tunnel oxide layer 435b, in accordance with embodiments. In embodiments, high-voltage tunnel oxide layer 435b may be formed to be thicker than low-voltage tunnel oxide layer 435a.

Figure 7B:
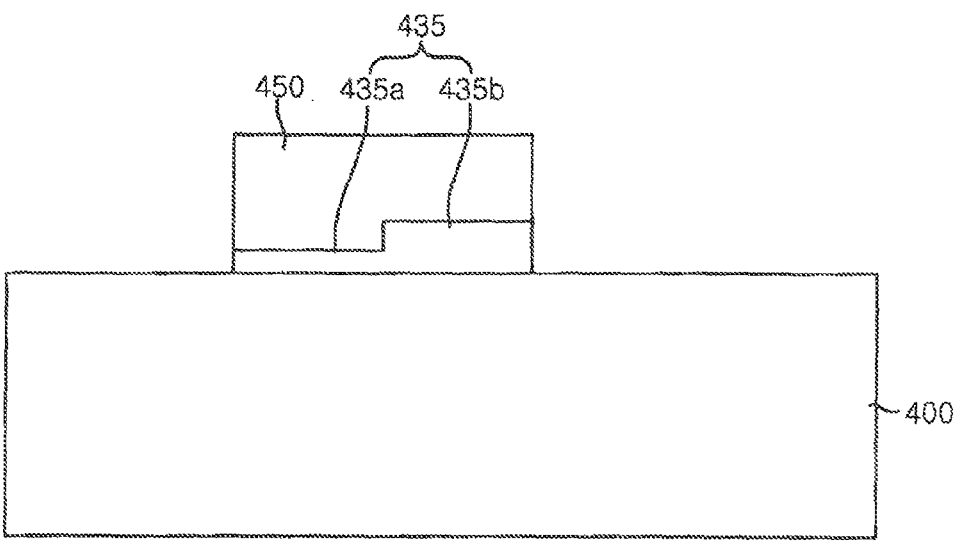

In embodiments, as illustrated in FIG. 7B, polysilicon may be deposited on the resultant substrate having low-voltage and high-voltage tunnel oxide layers 435a, 435b formed thereon, followed by etching the polysilicon, so that a floating gate 450 is formed on low-voltage and high-voltage tunnel oxide layers 435a, 435b.

Figure 7C:
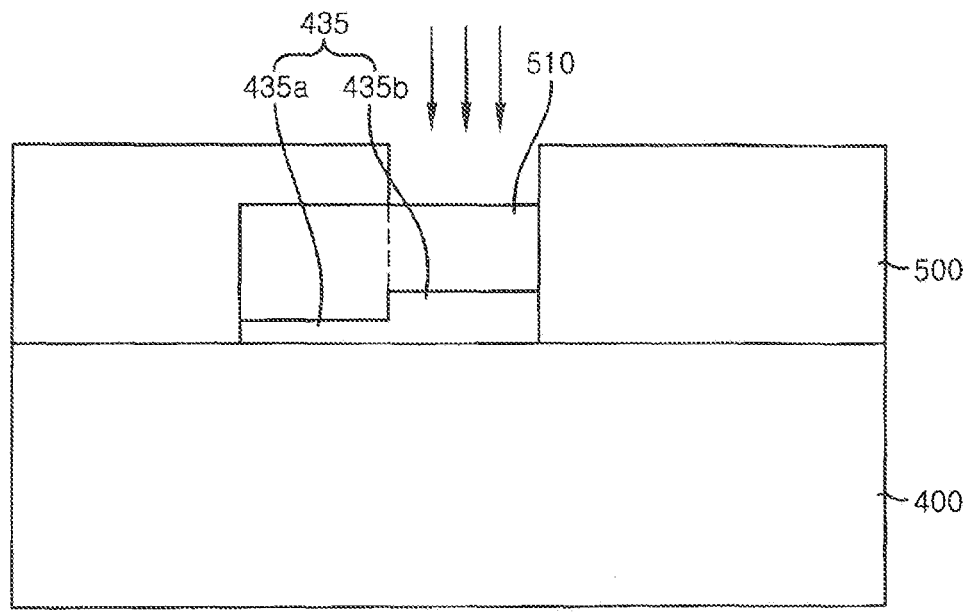

In embodiments, as illustrated in FIG. 7C, photoresist pattern 500 in which only the upper surface of first region 450a of floating gate 450 is opened is formed. A second conductive type impurity ion implantation process may be conducted using photoresist pattern 500 as an ion implantation mask, thus forming second conductive type impurity ion region 510 at first region 450a, in accordance with embodiments.

Figure 7D:
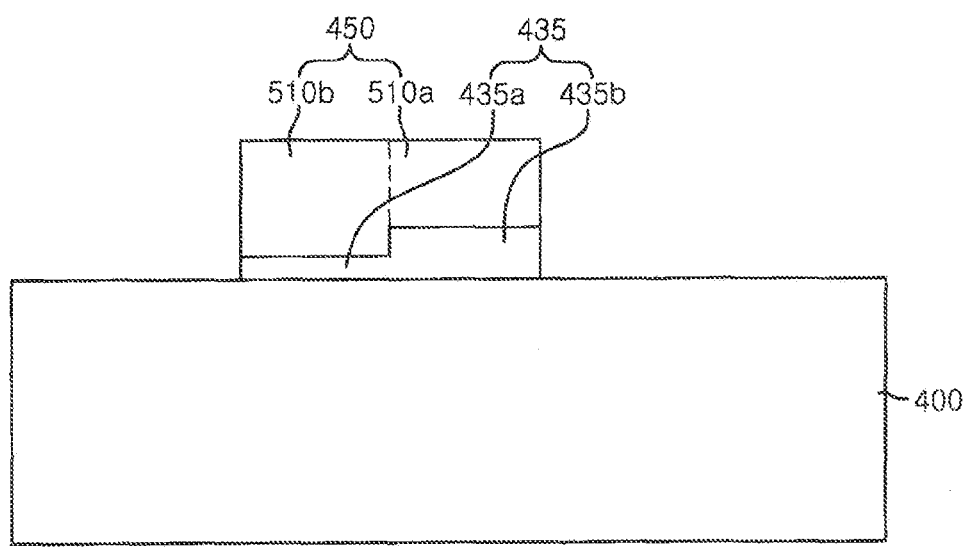

In embodiments, as illustrated in FIG. 7D, photoresist pattern 500 may be removed using a stripping process and a heat diffusion process is carried out, so that high-concentration second conductive type impurity region 510a is formed at first region 450a of floating gate 450. In embodiments, low-concentration second conductive type impurity region 510b is formed at second region 450b of floating gate 450 via diffusion of second conductive type impurity ions in first region 450a, thereby forming floating gate 450 including high-concentration and low-concentration second conductive type impurity regions 510a, 510b.

Figure 7E:
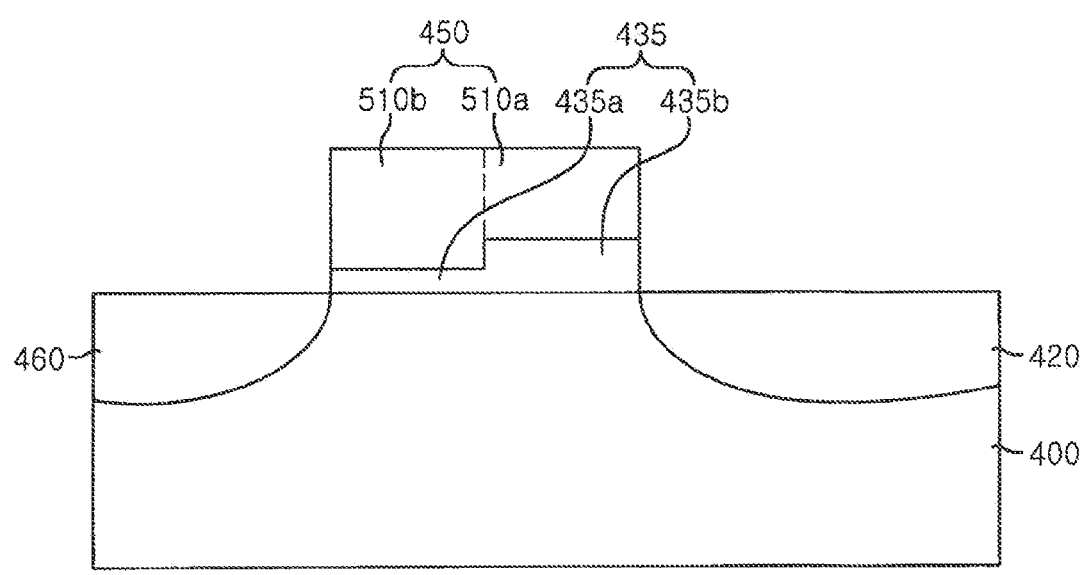

In embodiments, as illustrated in FIG. 7E, a high-concentration first conductive type impurity ion implantation process may be conducted, thus forming high-concentration impurity region 460 and drain region 420 in second conductive type well 400 exposed by the floating gate 450. In embodiments, an etched pattern may be formed by etching a portion of first region. 450a of floating gate 450 after formation of floating gate 450 or by etching a portion of first region 450a of floating gate 450 after formation of high-concentration and low-concentration second conductive type impurity regions 510a, 510b.

In embodiments, tunnel oxide layer 435 may be formed to have different thicknesses under floating gate 450, thus making it possible to execute two types of programming using a single floating gate 450. In embodiments, floating gate 450 may have different second conductive type impurity concentration distributions provided, thus causing an operating voltage-difference using a work-function difference of floating gate 450.

As described hereinbefore, embodiments provides a single poly EEPROM and a method for fabricating the same. In accordance with embodiments, a tunnel oxide layer may be formed to have different thicknesses under a floating gate, making it possible to execute two types of programming using a single cell, consequently increasing cell density.

In accordance with embodiments, an etched pattern may be formed in a partial region of a floating gate, thus causing electric field crowding, which may consequently reduce an operating voltage. In accordance with embodiments, the floating gate may be configured to have different conductive type impurity concentration distributions, thus causing an operating voltage difference using a work-function difference of the floating gate.

While the embodiments have been shown and described, it will be understood by those skilled in the art that various changes and modifications may be made without departing from the spirit and scope of the embodiments as defined in the following claims.

What is claimed is:

1. A single poly EEPROM (Electrically Erasable Programmable Read Only Memory), comprising:
    a second conductive type well formed over a semiconductor substrate;
    first conductive type source and drain regions formed in the second conductive type well;
    a tunnel oxide layer formed over the second conductive type well;
    a floating gate formed over the tunnel oxide layer and configured to be doped with second conductive type impurity ions; and
    a first conductive type impurity region formed in the second conductive type well adjacent to the floating gate,
    wherein the floating gate is configured such that a concentration of the second conductive type impurity ions in a first region of the floating gate adjacent to the drain region is higher than that of a second region of the floating gate adjacent to the first conductive type impurity region.

2. The single poly EEPROM of claim 1, wherein the floating gate such that a width of the first region of the floating gate adjacent to the drain region is greater than the width of the second region of the floating gate adjacent to the first conductive type impurity region.

3. The single poly EEPROM of claim 1, wherein the floating gate has a pattern in which a portion of the first region of the floating gate adjacent to the drain region is etched.

4. The single poly EEPROM of claim 1, wherein the floating gate has a pattern in which a portion of the first region of the floating gate adjacent to the drain region is patterned to have recesses.

5. The single poly EEPROM of claim 1, wherein the single poly EEPROM executes hot electron injection programming.

6. The single poly EEPROM of claim 1, wherein the tunnel oxide layer has a thickness of a first region of the tunnel oxide layer adjacent to the drain region is greater than that of a second region of the tunnel oxide layer adjacent to the first conductive type impurity region.

7. The single poly EEPROM of claim 1, wherein the first conductive type is a P type impurity and the second conductive type is an N type impurity.

8. The single poly EEPROM of claim 1, wherein the second conductive type well is formed on the semiconductor substrate.

9. The single poly EEPROM of claim 1, wherein the tunnel oxide layer is formed on the second conductive type well.

10. The single poly EEPROM of claim 1, wherein the floating gate is formed on the tunnel oxide layer.

* * * * *